United States Patent [19]

Takahashi et al.

[11] Patent Number: 5,755,665
[45] Date of Patent: May 26, 1998

[54] APPARATUS AND METHOD FOR SIMULTANEOUS DETECTION OF MULTIPLE MAGNETIC RESONANCE IMAGES

[75] Inventors: Tetsuhiko Takahashi, Soka; Shigeru Watanabe, Ibaraki-ken; Kenji Takiguchi, Kashiwa, all of Japan

[73] Assignee: Hitachi Medical Corporation, Tokyo, Japan

[21] Appl. No.: 610,979

[22] Filed: Mar. 1, 1996

[30] Foreign Application Priority Data

Mar. 3, 1995 [JP] Japan ................. 7-068962

[51] Int. Cl.$^6$ ........................... A61B 5/055
[52] U.S. Cl. ...................... 600/410; 324/309
[58] Field of Search ............... 128/653.2; 324/306, 324/307, 309; 600/410

[56] References Cited

U.S. PATENT DOCUMENTS

| | | |
|---|---|---|
| 4,804,919 | 2/1989 | Takeuchi et al. . |
| 4,982,161 | 1/1991 | Twieg . |
| 5,162,730 | 11/1992 | Schmitt et al. ............. 324/309 |
| 5,221,898 | 6/1993 | Takiguchi et al. ............. 324/306 |
| 5,237,273 | 8/1993 | Plewes et al. . |
| 5,245,282 | 9/1993 | Mugler, III et al. . |
| 5,254,949 | 10/1993 | McDonald et al. ............. 324/309 |
| 5,270,654 | 12/1993 | Feinburg et al. . |
| 5,287,854 | 2/1994 | Leunbach . |
| 5,304,929 | 4/1994 | Fang et al. ............. 324/309 |
| 5,394,872 | 3/1995 | Takiguchi et al. . |
| 5,422,572 | 6/1995 | Yao . |
| 5,492,123 | 2/1996 | Edelman . |
| 5,493,224 | 2/1996 | Shiono et al. . |
| 5,521,505 | 5/1996 | Kohno ............. 324/309 |
| 5,539,311 | 7/1996 | Takiguchi et al. . |
| 5,541,513 | 7/1996 | Maier ............. 324/309 |
| 5,544,653 | 8/1996 | Takahashi et al. . |
| 5,562,515 | 10/1996 | Kondo ............. 324/309 |
| 5,568,050 | 10/1996 | Hennig . |
| 5,578,924 | 11/1996 | Dumoulin et al. . |
| 5,594,336 | 1/1997 | Gullapalli et al. ............. 324/309 |
| 5,602,476 | 2/1997 | Liu et al. . |
| 5,612,619 | 3/1997 | Feinberg ............. 324/309 |
| 5,615,676 | 4/1997 | Kohno . |
| 5,621,321 | 4/1997 | Liu et al. . |
| 5,633,586 | 5/1997 | Finn ............. 324/309 |
| 5,647,362 | 7/1997 | Fuderer et al. . |

*Primary Examiner*—Marvin M. Lateef
*Assistant Examiner*—Shawna J. Shaw
*Attorney, Agent, or Firm*—Antonelli, Terry, Stout & Kraus, LLP

[57] ABSTRACT

A nuclear magnetic resonance imaging apparatus and an imaging method. A slice gradient magnetic field and a first radio frequency (RF) pulse magnetic field or the first and second RF pulse magnetic fields are applied to an object so as to selectively excite nuclear spins of the object and to generate echo signals by the application of the magnetic fields. The echo signals are measured by applying to the object a read gradient magnetic field whose polarity inverses continuously at least a plurality of times. A plurality of first RF pulse magnetic fields are generated in one pulse sequence. These RF pulse magnetic fields excite the nuclear spins of a plurality of different slices, and a plurality of different slices are selected. Sets of a plurality of echo signals from different slices are defected whenever the read gradient magnetic field is applied.

19 Claims, 7 Drawing Sheets

APPARATUS AND METHOD FOR SIMULTANEOUS DETECTION OF MULTIPLE MAGNETIC RESONANCE IMAGES

BACKGROUND OF THE INVENTION

This invention relates to a nuclear magnetic resonance imaging (MRI) apparatus for measuring nuclear magnetic resonance (NMR) signals from an object and imaging the density distribution of nuclei and the density distribution of a relaxation time. More particularly, the present invention relates to an MRI apparatus and an MRI method which will be suitable for multiple slice imaging in echo planar imaging (EPI).

Figure 4:
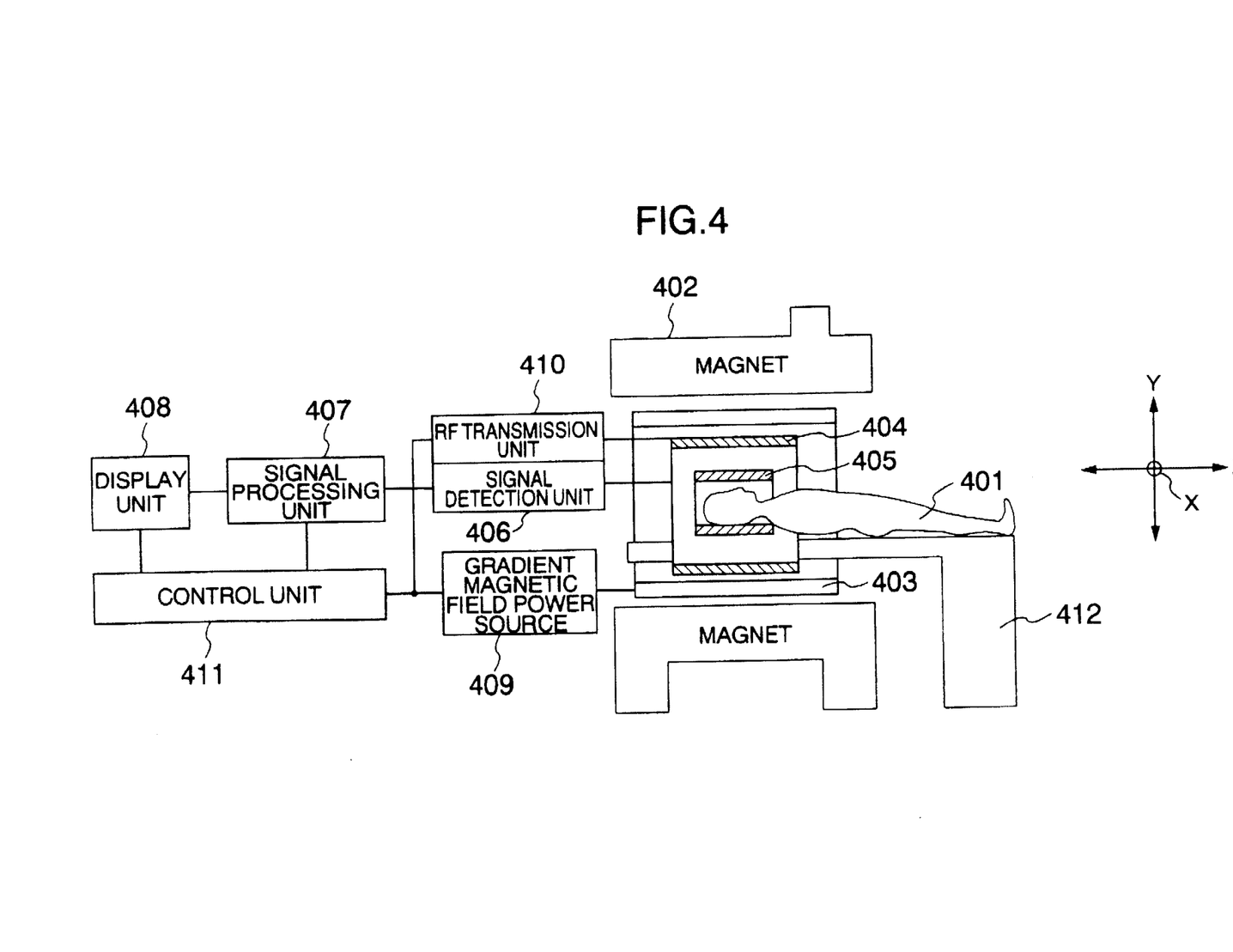
FIG. 4 is a block diagram showing schematically the construction of an MRI apparatus.

The construction of an MRI apparatus to which the present invention can be applied will be explained with reference to FIG. 4 of the accompanying drawings. The drawing is a block diagram schematically showing the construction of the MRI apparatus. A magnet 402 for generating a static magnetic field, a gradient magnetic field coil 403 for generating a gradient magnetic field inside the static magnetic field space, a radio frequency (RF) coil 404 for generating an RF magnetic field in the static magnetic field space and an RF probe 405 for detecting NMR signals generated from an object 401 are disposed around the object 401 lying down on a bed 412. The gradient magnetic field coil 403 comprises gradient magnetic field coils in X (perpendicular to the sheet of the drawing), Y and Z directions as indicated by arrows, and generates gradient magnetic fields in the X, Y and Z directions in accordance with signals from a gradient magnetic field power source 409, respectively. The RF coil 404 generates an RF magnetic field in accordance with signals from an RF transmission unit 410. The NMR signal detected by the RF probe 405 is detected by a signal detection unit 406, is subjected to an arithmetic operation such as Fourier transform by a signal processing unit 407 and is converted to image signals. The image is displayed by a display unit 408. The gradient magnetic field power source 409, an RF transmission unit 410 and the signal detection unit 406 are controlled by a control unit 411, and a time chart of their control is generally referred to as a "pulse sequence".

The imaging object of the existing MRI apparatuses, which has been wide spread in clinical diagnosis, is the protons in the object. The shapes or functions of the head, the abdominal region, the limbs, etc, of the human body are imaged two-dimensionally or three-dimensionally by imaging the spatial distribution of this proton density and the spatial distribution of relaxation of the excited state.

Next, an ordinary imaging method will be explained. Slice selection and an imaging position of the object are determined by controlling the gradient magnetic field in each of the X, Y and Z directions. Different phase encodings are then applied to the slice position so selected, and echo signals obtained by respective phase encoding are detected. One MRI image is generated by effecting two-dimensional Fourier transform for all these echo signals. The number of phase encodings is generally 128, 256, 512, etc. Each echo signal is obtained as a time series signal comprising 128, 256, 512 or 1,024 sampling data.

Figure 2:
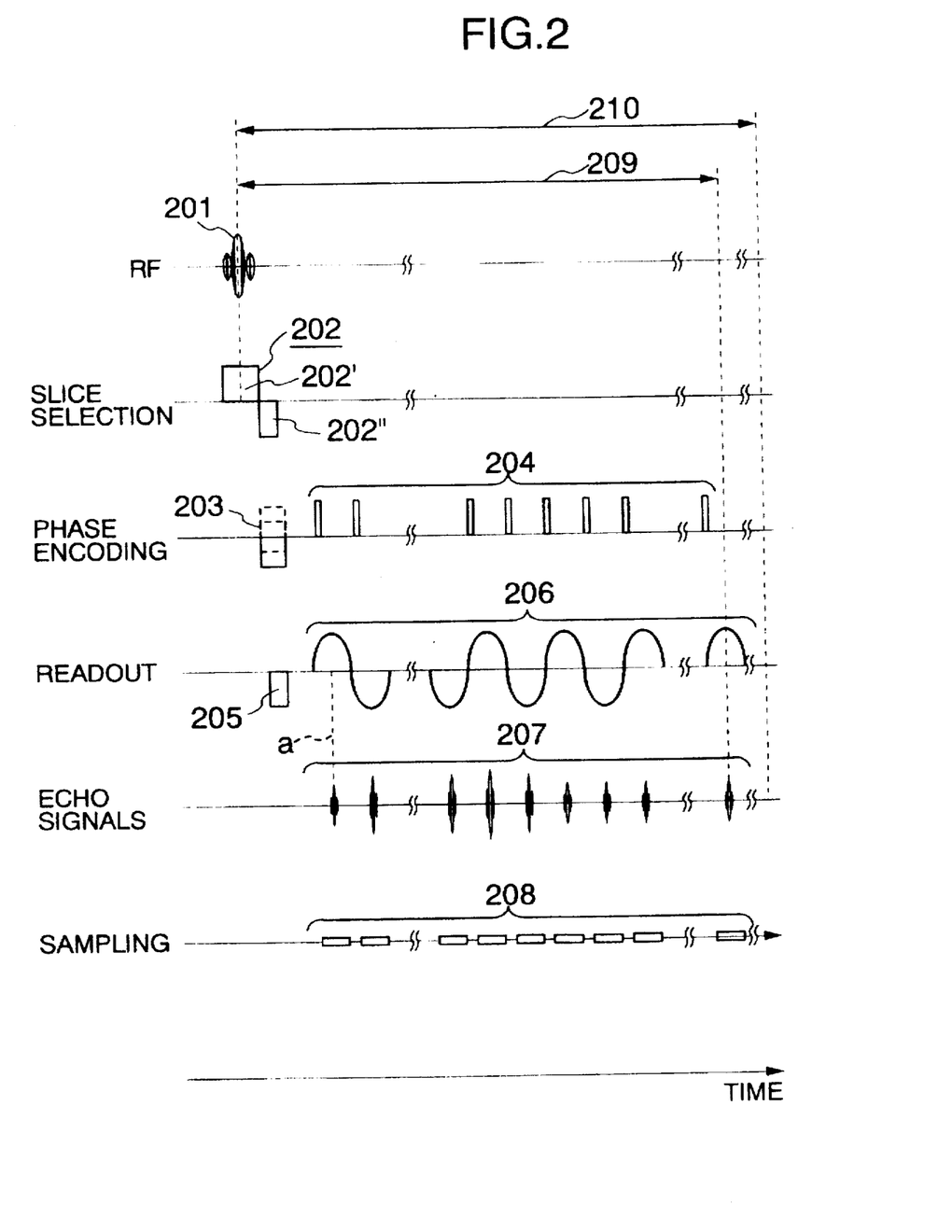
FIG. 2 is a timing chart of a pulse sequence in EPI according to the prior art.

Echo planar imaging (EPI) is a typical example of high speed imaging methods. FIG. 2 shows the pulse sequence of this EPI. A 90° pulse 201 for exciting the nuclear spins in the object are applied to the object 401 and at the same time, the gradient magnetic field pulse 202 for selecting the slices is applied to the object 401. These 90° pulse 201 and gradient magnetic field pulse 202 determine the position of the slice and its thickness. This gradient magnetic field pulse 202 generally comprises a selection pulse 202' for selecting the slice and an inversion pulse 202" for aligning the phases inside the slice. For, all the nuclear spins at the center of the selected slice have a 90° phase but at the positions spaced apart from the slice center, the phases are ahead of or behind 90° due to influences of the gradient magnetic fields. Therefore, the inversion pulse 202" is applied so as to retard or advance the phase error and to align the phases of the nuclear spins inside the slice. The inversion pulse 202" is generally a pulse having an area ratio of about ½ of the selection pulse 202'.

Next, a phase encoding offset pulse 203 for splitting the selected slice and applying phase encoding for determining the occurrence positions of the respective echo signals and a read pulse 205 for applying a gradient magnetic field necessary for generating the echo signals are applied to the object 401. Here, EPI can be divided into two types depending on the method of the application of the phase encoding offset pulse 203. The method which can acquire all the echo signals by applying once the phase encoding offset pulse 203 is referred to as "one shot EPI", and the method which repeatedly applies step-wise the phase encoding offset pulses 203 and acquires the image by combining the echo signals of each time of application is referred to as "multiple shot EPI". In other words, one shot EPI acquires one image by one RF excitation operation while multiple shot EPI acquires one image by repeating a plurality of times the RF excitation operation. The phase encoding pulse 203 represented by dotted lines in FIG. 2 shows the phase encoding pulses applied three times after the first shot in multiple shot EPI.

After the read pulse 205 is applied, the inversion pulse 206 whose polarity inverses continuously and alternately is applied, and the phase encoding pulse 204 which determines the split number in the phase encoding direction inside the slice is discretely applied in synchronism with the inversion pulse 206. Then, the echo signals 207 of different phase encodings occur in time series within each cycle of the read inversion pulse 206, and these echo signals 207 are then sampled. The area of the read pulse 206 (that is, time integration of intensity) generally has the relation of double the area of the read pulse 205. The echo signal 207 occurs (at an intermediate position a of one read pulse 206) when the nuclear spin is dephased by the application of the read pulse 205 and when the nuclear spin is rephased by the application of the read inversion pulse 206. The next echo signal 207 occurs when the nuclear spin is again dephased by the remaining half of the read inversion pulse 206 after rephasing and when the nuclear spin is rephased by the application of the next read inversion pulse 206. In other words, the echo signals 207 occur one after another in the vicinity of the center of each read inversion pulse 206. The echo signals 207 so obtained are sampled by the time 208 and are arithmetically processed so as to reconstruct the image.

Multiple slice imaging is known as means for imaging a plurality of slices in the MRI apparatus. In the imaging process by the spin echo method or the like, a gap of about 0.5 to 1 second exists between the echos. Therefore, the 90° pulses and the gradient magnetic pulses of different slices are applied to the object by utilizing this time interval, and the echo signals are arithmetically processed for each slice so as to obtain a plurality of slice images. In EPI, however, the interval of the echo signals is as short as from 0.5 to 1 ms and consequently, the echo signals of other slices cannot be obtained within this time.

Therefore, when multiple slice imaging is effected in EPI, a group of echo signals (207) of other slices are generated during the empty period between the adjacent shots (209) effected repeatedly by multiple shot EPI. This method will be explained about multiple shot EPI for imaging two slices by n shots, respectively, with reference to FIG. 3. In multiple shot EPI, the 90° pulses 201 are repeatedly applied n times (n: integer of 2 or more). In other words, n times of split sequences are repeated. After the passage of the repetition time 210 from the 90° pulse 201, the next 90° pulse is generated. The echo operation 2091 is defined as the time from the start of the first one-split 90° pulse 201 in the first slice to the occurrence of the last echo signal 207 that can be acquired within this pulse sequence. The one-split echo operation 2091' in the second slice is carried out during the period from the end of the echo operation 2091 to the start of the two-split echo operation 2092 in the second slice. In this way, the echo operation 209n of the first slice and the echo operation 209n' of the second slice are alternately repeated, and after the end of the nth-split echo operation 209' of the second slice, the echo signals are arithmetically processed for each slice and the image is obtained.

Figure 3:
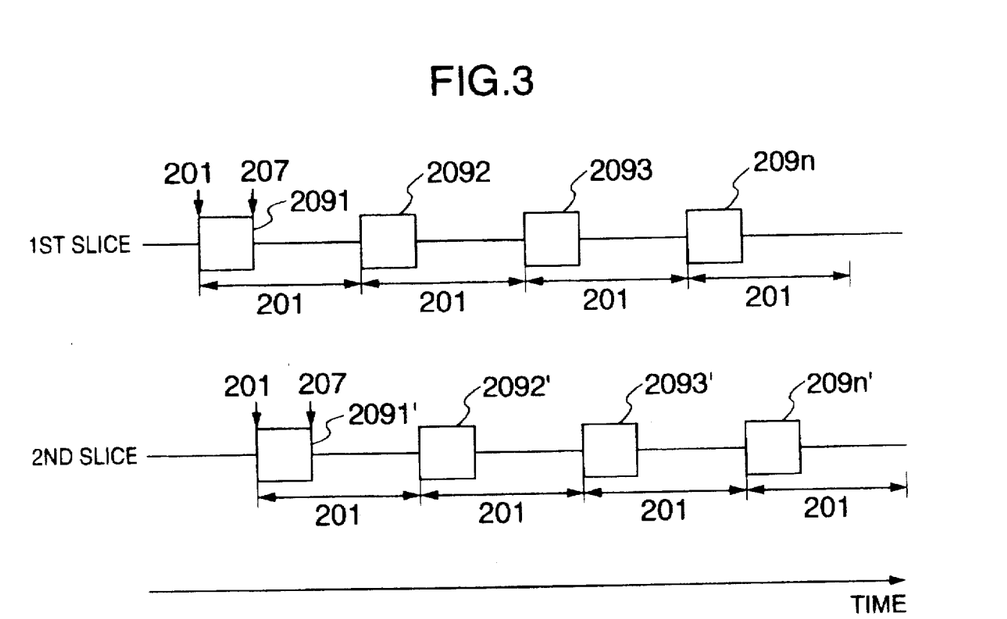
FIG. 3 is a timing chart useful for explaining the operation of multiple slice imaging in multiple shot EPI according to the prior art.

A time of about 1 ms is necessary for sampling 208 of each echo signal 207 in one shot EPI, and the interval between the adjacent samplings is from 0.5 to 1 ms. The time necessary for the echo operation is about 100 ms and the repetition time 210 is about 1 to about 2 seconds. Due to these limitations, setting of a plurality of slices cannot be made in each split pulse sequence 209n in one shot EPI because the sampling interval is too short. In order to conduct multiple slice imaging, therefore, all the echo signals of one slice are acquired and then the pulse sequence of another slice is carried out. However, this method requires a long time to generate the images of a plurality of different slices.

In multiple shot EPI, on the other hand, the echo operation 209 of another slice is conducted by utilizing the time during the repetition of the echo operation. Because the echo operation 209 is repeated a plurality of times in multiple shot EPI, however, the time required for acquiring all the echo signals 207 corresponding to one image is extended.

SUMMARY OF THE INVENTION

It is an object of the present invention to provide an MRI apparatus and an MRI method which can conduct multiple slice imaging even in one shot EPI and which can reduce the imaging time.

It is another object of the present invention to increase the number of slices in multiple slice imaging of multiple shot EPI and to improve efficiency of diagnosis.

In the MRI apparatus and the MRI method according to the present invention, a slice gradient magnetic field and a first radio frequency (RF) pulse magnetic field or the first and second RF pulse magnetic fields are applied to an object so as to selectively excite nuclear spins of the object by the application of the magnetic fields a to generate echo signals, and a read gradient magnetic field whose polarity inverses at least continuously a plurality of times is applied to the object to measure the echo signals. A plurality of first RF pulse magnetic fields are generated within one pulse sequence. These RF pulse magnetic fields excite the nuclear spins of a plurality of different slices, and a plurality of different slices are selected. Sets of a plurality of echo signals of different slices are detected whenever the read gradient magnetic field is applied.

Selection of the slices at a plurality of different positions is carried out in time series, and after the first read gradient magnetic field for each of the slices is applied in time series, a second read gradient magnetic field whose polarity inverses is applied. Then, the echo signals from a plurality of slices can be detected in time series within each cycle of the second read gradient magnetic field. These echo signals are used for imaging for each slice. In this way, multiple slice imaging in one shot EPI becomes possible and the imaging time can be shortened.

DESCRIPTION OF THE PREFERRED EMBODIMENTS

Figure 1:
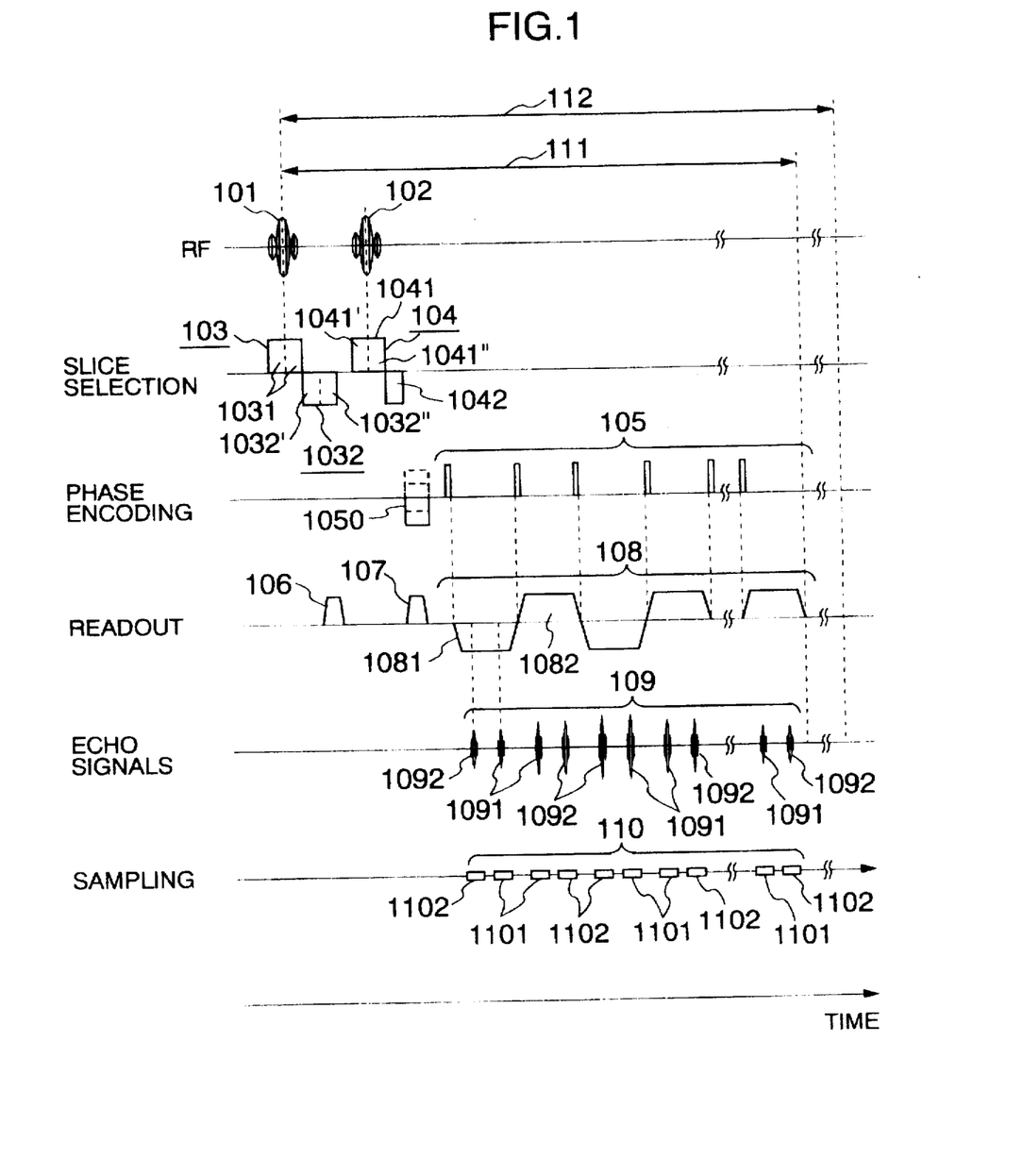
FIG. 1 is a timing chart of a pulse sequence useful for explaining the operation of multiple slice imaging in one shot echo planar imaging (EPI) in the first embodiment of the present invention.

The first embodiment of the present invention will be explained with reference to FIG. 1. This drawing is a timing chart of a pulse sequence which is useful for explaining the operation of multiple slice imaging in one shot EPI. Incidentally, the pulse sequence operation in each of the following embodiments is executed by an MRI apparatus shown in FIG. 4. First, a first 90° pulse 101 is applied to an object 401 in order to excite a nuclear spin of the object 401. Subsequently, a second 90° pulse 102 is applied to the object 401. At this time, a first gradient magnetic field pulse 103 is applied simultaneously with the first 90° pulse 101 to the object 401, and a second gradient magnetic field pulse 104 is applied simultaneously with the second 90° pulse to the object 401. In this way, first and second slices that are mutually different are selected.

The first gradient magnetic field pulse 103 comprises a selection pulse 1031 for slice selection and an inversion pulse 1032 in the same way as in the prior art technology. The inversion pulse 1032 includes an inversion 1032' for aligning the phases of the nuclear spins at the former half thereof and an inversion 1032" for cancelling a gradient magnetic field component generated by the second gradient magnetic field pulse 104 at the latter half thereof. In this embodiment, the inversion pulse 1032' and the cancel quantity 1032" together constitute one continuous pulse, but they may be separate pulses, too. When the second gradient magnetic field pulse 104 is applied to the nuclear spins excited by the first 90° pulse 101 and the gradient magnetic field pulse 103, the phases of the nuclear spins so excited dephase and no echo signal is generated. To avoid this problem, the phases of the nuclear spins must be rephased or returned. Therefore, the gradient magnetic field pulses applied after the selection pulse 1031 and the inversion pulse 1032' may be those which do not affect the excited nuclear spins. The inversion pulse 1042 of the second gradient magnetic field pulse 104 and the latter half 1041" of the selection pulse 1041 cancel each other and the former half 1041' of the selection pulse 1041 and the cancel pulse 1032" cancel each other. In consequence, the nuclear spins excited by the first 90° pulse and the first gradient magnetic field pulse 103 are not sensitive to the second gradient magnetic field pulse 104. Because the first gradient magnetic field pulse 103 of the preceding stage does not affect the second gradient magnetic field pulse 104, the latter need not contain the cancel quantity. When the number of slices is three (3), the shapes of the first and second gradient magnetic field pulses may be changed in such a manner as to cancel the second and third gradient magnetic field pulses.

Further, a first read pulse 106 is applied after the application of the first 90° pulse 101 and a second read pulse 107 is applied after the application of the second 90° pulse. In this embodiment, the first and second read pulses 106 and 107 have an equal shape. The read pulses 106 and 107 diffuse the nuclear spins excited by the first and second slice selections.

After the second read pulse 107 is applied, a continuous read inversion pulse 108 is applied. In this embodiment, the read inversion pulse 108 comprises those pulses whose polarities inverse alternately, and the height of the read inversion pulse 108 is equal to that of the read pulses 106 and 107 but its width is thrice. A base encoding offset pulse 1050 is applied to the object simultaneously with the application of the second read pulse 107, and the phase encoding pulses 105 are discretely applied to the object in synchronism with the read inversion pulse 108. When the pulses are applied to the object in such a pulse sequence, the echo signals 1091 and 1092 are generated in a time series within each cycle of the read inversion pulse 108 in such a manner as to correspond to the first and second slices. Even when the phase encoding offset pulse 1050 is applied after the second read pulse 107, the generation of the echo signals is not at all affected.

Next, the generation of these echo signals 1091 and 1092 will be explained. First, when the first read inversion pulse 1081 is applied, the echo signal 1092 of the second slice is first generated and then the echo signal 1091 of the first slice is generated. This is because the rephasing positions of the nuclear spins, which are dephased by the read pulses 106 and 107, due to the application of the read inversion pulse 1081, are mutually different.

In other words, the first echo signal 1091 dephases the nuclear spins by the sum of the first read pulse 106 and the second read pulse 107. In contrast, the second echo signal 1092 dephases the nuclear spins by the second read pulse 107. It can be understood from above that the echo signal first generated by the application of the read inversion pulse 1081 occurs at the rephasing position of the second read pulse 107 (the position of ⅓ ahead of the read inversion pulse 1081) and the next echo signal occurs at the rephasing position of the sum of the first and second read pulses 106 and 107 (the position of ⅔ ahead of the read inversion pulse 1081).

Next, when the second read inversion pulse 1082 is applied, the second echo signal 1092 occurs after the first echo signal 1091 occurs, on the contrary. This is because dephasing is again effected by the read pulse 1081 applied immediately after rephasing. Because the nuclear spin of the first slice is dephased by ⅓ from the back of the read inversion pulse 1081, it rephases at ⅓ from ahead of the read inversion pulse 1082 and the first echo signal 1091 is generated. The nuclear spin of the second slice dephases by ⅔ from the back of the read inversion pulse 1081 and rephases at ⅔ from ahead of the read inversion pulse 1082, and the second echo signal 1092 is generated.

Whenever the read inversion pulse 108 repeats as described above, the first and second echo signals 1091 and 1092 can be obtained and are detected for each slice within the range of a sampling time 110. After all the echo signals 109 are detected, the sampling time 1101 for detecting the echo signal 1092 corresponding to the first slice and the sampling time 1102 for detecting the echo signal 1092 corresponding to the second slice are separated, and the images of the first and second slices are reconstructed.

This embodiment can execute multiple slice imaging in one shot EPI that has not been possible in the past. Because the echo signals 1091 and 1092 can be acquired twice by the application of the read inversion pulse 108, the number of times of inversion of the gradient magnetic field decreases in comparison with the imaging method which repeats twice one shot EPI, and various influences on the object at the time of inversion of the gradient magnetic field can be reduced. When the relationship between the effective time of the read inversion pulse 108 (the time corresponding to the apex of the trapezoidal pulse) and the waste time of the rise and the fall (the time corresponding to the slopes of the trapezoidal pulse) is compared with that of the prior art, the waste time occurs twice per slice in the prior art, whereas it occurs only once in this embodiment. For this reason, the waste time can be reduced much more than when one shot EPI is repeated, and the necessary time can be reduced.

Though this embodiment handles two slices, it can simultaneously image three or more slices. In this case, three 90° pulses, three (or more) gradient magnetic fields and three (or more) read pulses are used, respectively. Though this embodiment uses the trapezoidal pulse for the read inversion pulse 108, multiple slice imaging in one shot EPI becomes possible by using known inversion pulses such as a Sin pulse, a rectangular pulse, and so forth.

Figure 5:
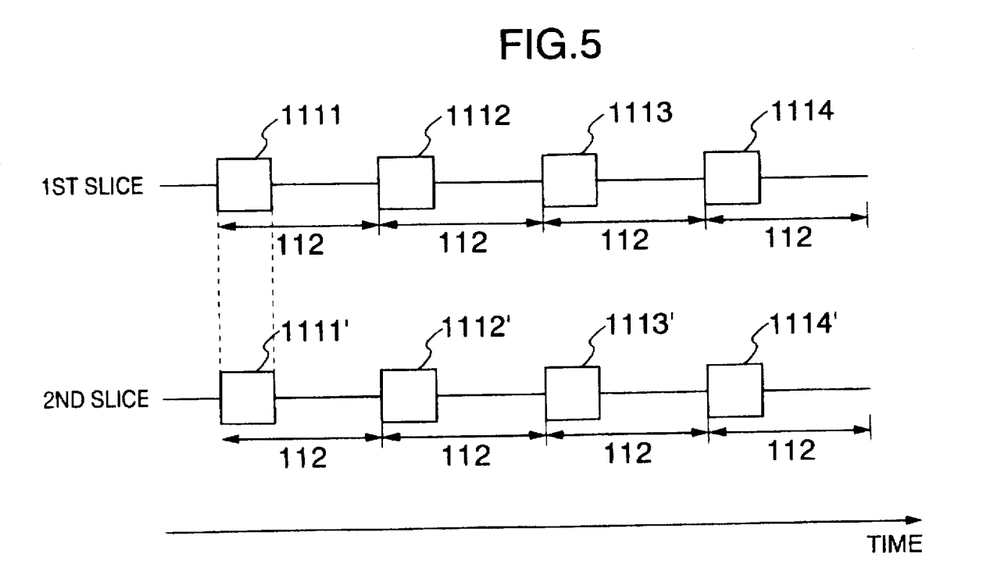
FIG. 5 is a timing chart of echo operations of a plurality of slices in multiple shot EPI according to the second embodiment of the present invention.

Next, the second embodiment of the present invention will be explained with reference to FIGS. 1 and 5. FIG. 5 is a time chart of the echo operation for each slice in multiple shot EPI in this embodiment. In multiple shot EPI, while the echo operation 111 shown in FIG. 1 is repeated a plurality of times (four times), the phase encoding offset pulse 1050 is changed stepwise so that the pulses become different in each time of repetition as the pulse represented by dotted lines in FIG. 1. The image is reconstructed by combining all the echo signals 109 obtained in each echo operation period 111 of a plurality of divided echo operations 1111, 1112, 1113 and 1114. In other words, the echo signal 109 is divided into a plurality of signals and one image is obtained.

In the case of four-split multiple shot image of two-slice image, for example, the echo operation 111 is repeated four times. The first echo operation 1111 and the second echo operation 1111' are simultaneously made at the first time, and after the passage of the repetition time 112, the next echo operations 1112 and 1112' are carried out. These operations are repeated until the echo operation of the fourth time can be obtained.

When multiple slice imaging is carried out in multiple shot EPI according to the prior art, the echo operation is deviated for each slice. However, since the echo operation 111 of a plurality of slices can be effected simultaneously in the embodiment of the present invention, the acquisition time of all the echo signals can be shortened.

Though this embodiment deals with two slices, it would be obvious from the first embodiment that three or more slices can be simultaneously imaged.

Figure 6:
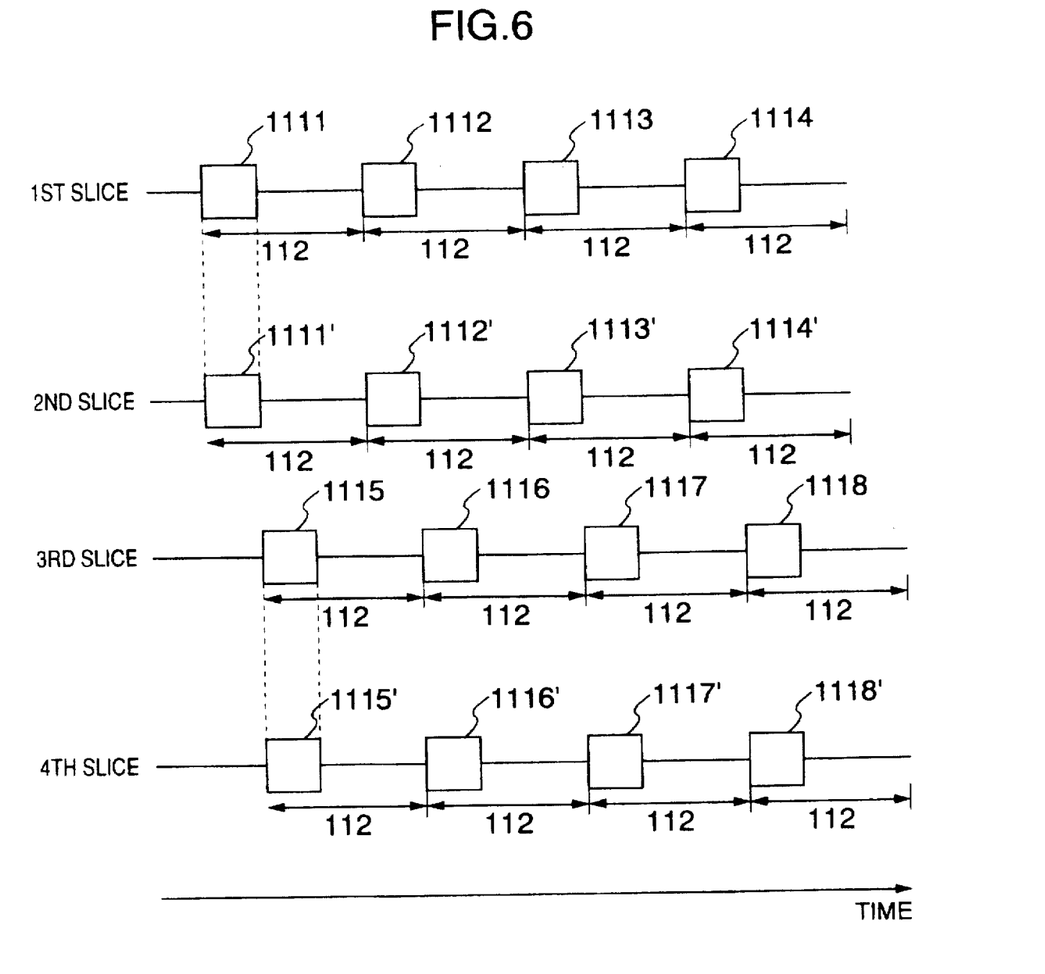
FIG. 6 is a timing chart of echo operations of a plurality of slices in multiple shot EPI according to the third embodiment of the present invention.

Next, the third embodiment of the present invention will be explained with reference to FIG. 6. This drawing is a timechart of the echo operation for each slice in multiple shot EPI in this embodiment. The embodiment comprises the combination of multiple shot EPI for effecting multiple slice imaging by deviating the time as is made in the prior art with multiple shot EPI capable of simultaneously effecting multiple slice imaging. Incidentally, multiple slice imaging in multiple shot EPI according to the prior art will be hereby explained. The echo operations 1115 to 1118 are carried out after the echo operations 1111 to 1114 shown in FIG. 6, respectively. In this embodiment, the second echo operations 1111' to 1114' are carried out simultaneously with the first echo operations 1111 to 1114, respectively, and the fourth echo operations 1115' to 1118' are carried out simultaneously with the third echo operations 1115 to 1118, respectively.

According to this method, the double number of slices can be imaged in the same time as the time required for multiple slice imaging in multiple shot EPI according to the prior art. If the number of slices obtained by one echo operation is set to three or more, imaging of multiple slices thrice as many as the slices of the prior art can be of course carried out.

Figure 7:
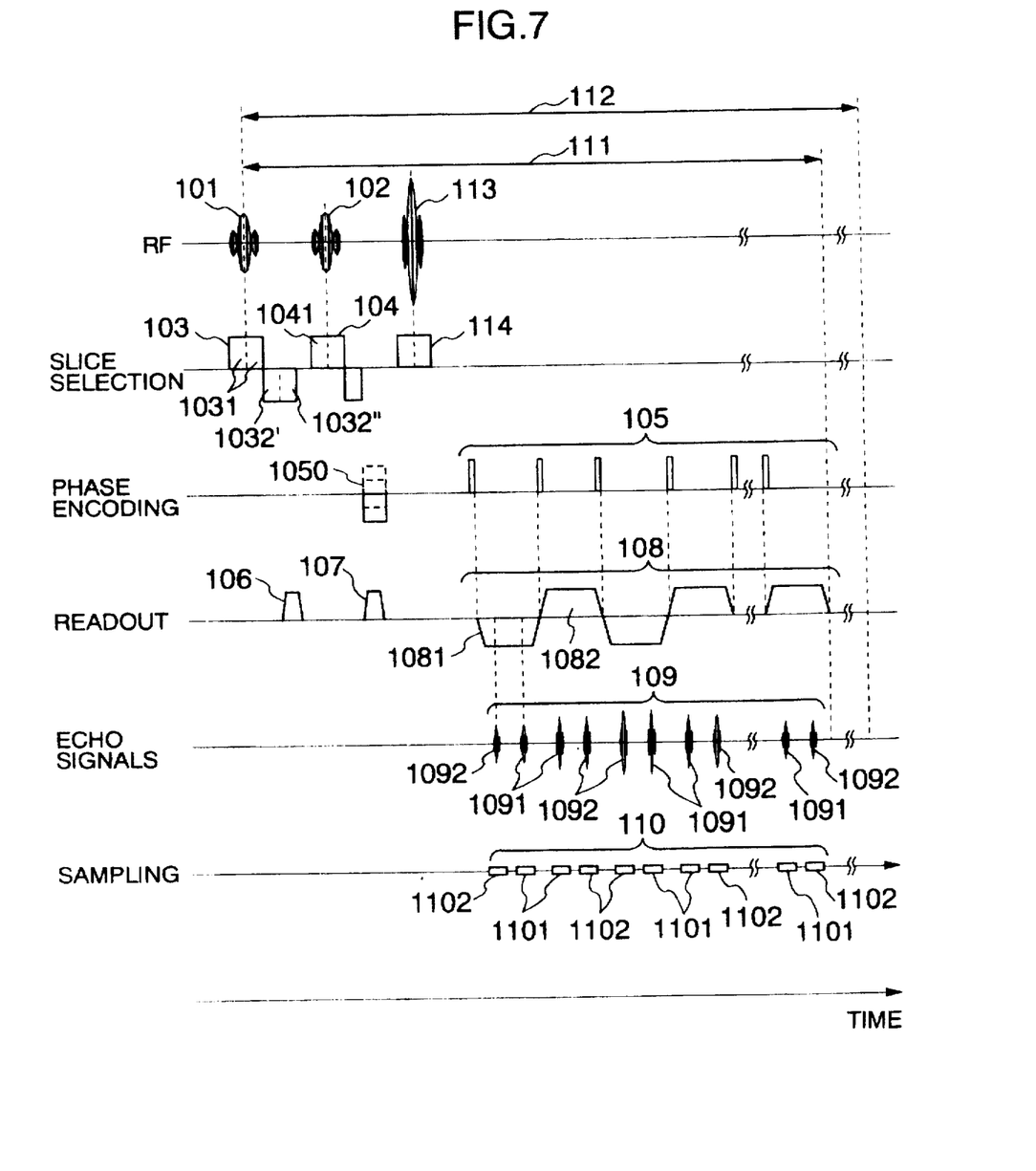
FIG. 7 is a timing chart of a pulse sequence useful for explaining the operation of multiple slice imaging in a spin echo type EPI according to the fourth embodiment of the present invention.

Next, the fourth embodiment of the present invention will be explained with reference to FIG. 7. FIG. 7 shows a pulse sequence representing multiple slice imaging in spin echo type EPI according to this embodiment. In this embodiment, a 180° pulse 113 for inverting the phase of the nuclear spin is applied after the second read pulse 107 in the first embodiment and at the same time, the gradient magnetic field pulse 114 is applied. This embodiment, too, can obtain the same effect as that of the first embodiment. In order to invert the nuclear spins of both the first and second slices, the frequency band of the signal constituting the 180° pulse 113 is set to a broad band.

Accordingly, the time in which the pulse is applied is shorter than that of the first embodiment, but this is not shown in the drawing. On the other hand, it is also possible to reduce the intensity of the gradient magnetic field pulse in such a manner as to correspond to the first and second slices, instead of enlarging the frequency band of the 180° pulse. Though the 180° pulse 113 and the slice selection pulse 114 are shown forming a pair in FIG. 7, the pulses may be divided into two sets of pulses corresponding to the first and second slices.

Figure 8:
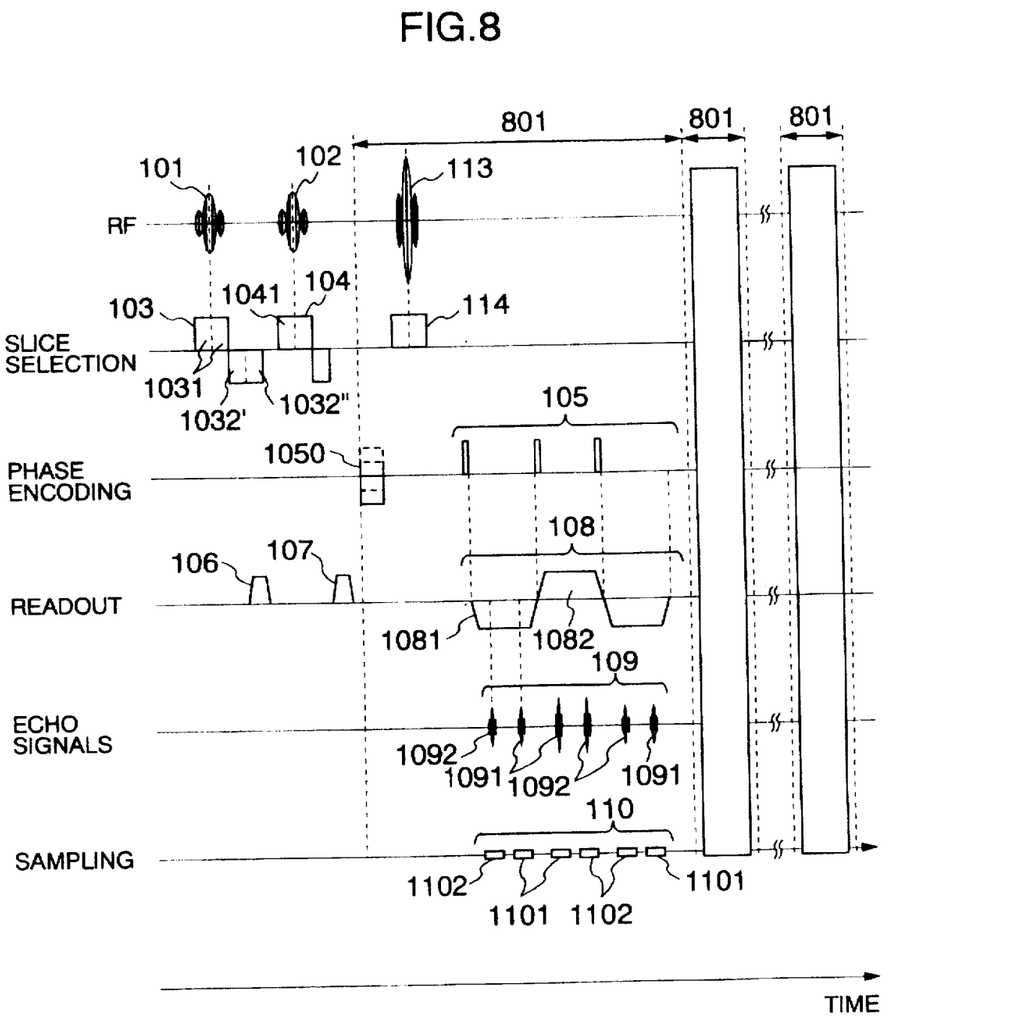
FIG. 8 is a timing chart of a pulse sequence useful for explaining the operation of multiple slice imaging in first spin echo type EPI according to the fifth embodiment of the present invention.

Next, the fifth embodiment of the present invention will be explained with reference to FIG. 8. This drawing is a pulse sequence representing multiple slice imaging in fast spin echo type EPI. This embodiment repeatedly applies the 180° pulses 113 during one echo operation 111 of the fourth embodiment and samples the echo signals (801). This embodiment, too, can obtain the same effect as that of the first embodiment.

According to the present invention, after a plurality of slices are selected by using a plurality of first RF pulses, a series of echos are measured and the images of a plurality of slices can be obtained.

According to the present invention, a plurality of slices are selected by exciting the nuclear spins of a plurality of mutually different slices in time series and by applying the first read gradient magnetic field as well as the second read gradient magnetic field, and the echo signals from these slices are detected in time series. Therefore, multiple slice imaging in one shot EPI becomes possible and the imaging time can be shortened.

The number of slices of multiple slice imaging can be increased in addition to the reduction of the imaging time in multiple slice imaging in multiple shot EPI, and efficiency of diagnosis can be improved.

What is claimed is:

1. A nuclear magnetic resonance imaging apparatus for generating a tomographic image of an object by executing at least once a pulse sequence including the steps of applying a slice gradient magnetic field and a first radio frequency (RF) pulse magnetic field or said first RF pulse magnetic field and a second RF pulse magnetic field to said object, generating echo signals by selectively exciting nuclear spins of said object by the application of said first RF pulse magnetic field or said first and second RF pulse magnetic fields, applying a read gradient magnetic field whose polarity continuously inverses at least a plurality of times to said object, and measuring said echo signals; said apparatus comprising:

magnetic field generation means for generating a plurality of said first RF magnetic pulse fields within one pulse sequence, exciting the nuclear spins of a plurality of different slices and selecting a plurality of said slices; and signal detection means for detecting sets of the echo signals from a plurality of said slices which have been selected and excited whenever said read gradient magnetic field is applied.

2. A nuclear magnetic resonance imaging apparatus according to claim 1, wherein said magnetic field generation means generate in time series a plurality of said first RF pulse magnetic fields.

3. A nuclear magnetic resonance imaging apparatus according to claim 1, wherein:

said read gradient magnetic field includes a first read gradient magnetic field applied in time series to said object in such a manner as to correspond to a plurality of said slices and a second read gradient magnetic field applied to said object while the polarity thereof inverses alternately;

said first read gradient magnetic field dephases the nuclear spins of a plurality of said slices in mutually different quantities; and said second read gradient magnetic field rephases the nuclear spins of a plurality of said slices dephased at mutually different timings corresponding to the dephase quantities within a predetermined cycle of said second read gradient magnetic field to thereby generate the echo signals and at the same time, dephases again the nuclear spins of a plurality of said slices in mutually different quantities.

4. A nuclear magnetic resonance imaging apparatus according to claim 1, wherein said magnetic field generation means applies repeatedly at least twice said second RF pulse magnetic field and said read gradient magnetic field whose polarity alternately inverses with the application of said slice gradient magnetic field and said first RF pulse magnetic field, to said object.

5. A nuclear magnetic resonance imaging apparatus according to claim 3, wherein said first read gradient magnetic field is a plurality of magnetic pulse signals the time integration values of the amplitudes of which are mutually equal.

6. A nuclear magnetic resonance imaging apparatus according to claim 5, wherein said second read gradient magnetic field is a plurality of continuous magnetic field pulses whose polarity alternately reverses in a predetermined cycle, and the time integration value of the amplitude of said continuous magnetic field pulses is substantially equal to three times the time integration value of the amplitude of each of the pulse signals of said first read gradient magnetic field.

7. A nuclear magnetic resonance imaging apparatus for generating a tomographic image of an object by executing at least once a pulse sequence including the steps of applying a slice gradient magnetic field and a first radio frequency (RF) pulse magnetic field or said first RF pulse magnetic field and a second RF pulse magnetic field to said object, generating echo signals by selectively exciting nuclear spins of said object by the application of said first RF pulse magnetic field or said first and second RF pulse magnetic fields, applying a read gradient magnetic field whose polarity continuously inverses at least a plurality of times to said object, and measuring said echo signals; said apparatus comprising:

slice selection means for selecting a plurality of different slices by applying a plurality of RF pulse magnetic fields having mutually different frequencies in time series to said object containing the nuclear spins to be detected, and simultaneously applying a slice gradient magnetic field in time series to said object;

phase encoding means for effecting phase encoding by applying a phase encoding gradient magnetic field to each of the excited spins of a plurality of said slices which have been selected;

detection means for detecting in time series the echo signals from a plurality of said slices within a cycle of a second read gradient magnetic field by generating a first read gradient magnetic field for dephasing the nuclear spins selected and excited, applying said first read gradient magnetic field to said object, generating then a second read gradient magnetic field whose polarity alternately inverses within a predetermined cycle and applying it to said object in synchronism with said phase encoding operation; and image reconstruction means for reconstructing an image of each slice from the echo signal corresponding to each of a plurality of said slices.

8. A nuclear magnetic resonance imaging method for generating a tomographic image of an object by executing at least once a pulse sequence including the steps of applying a slice gradient magnetic field and a first radio frequency (RF) pulse magnetic field or said first RF pulse magnetic field and a second RF pulse magnetic field to said object, generating echo signals by selectively exciting nuclear spins of said object by the application of said first RF pulse magnetic field or said first and second RF pulse magnetic fields, applying a read gradient magnetic field whose polarity continuously inverses at least a plurality of times, to said object, and measuring said echo signals; said method comprising the steps of:

generating a plurality of said first RF pulse magnetic fields within one pulse sequence so as to excite the nuclear spins of a plurality of different slices and selecting a plurality of said slices; and detecting the echo signals from a plurality of said slices which have been selected and excited as sets of a plurality of echo signals whenever said read gradient magnetic field is applied.

9. A nuclear magnetic resonance imaging apparatus for generating a tomographic image of an object by executing at least one pulse sequence including the steps of applying a slice gradient magnetic field and a first radio frequency (RF) pulse magnetic field or first and second RF pulse magnetic fields to said object, generating echo signals by selectively exciting nuclear spins of said object by the application of said first RF pulse magnetic field or said first and second RF pulse magnetic fields, applying a read gradient magnetic field whose polarity continuously inverses at least a plurality of times to said object, and measuring said echo signals; said apparatus comprising:

magnetic field generation means for generating a plurality of said first RF pulse magnetic fields within one pulse sequence, exciting the nuclear spins of a plurality of different slices and selecting a plurality of said slices; and signal detection means for detecting sets of the echo signals from the excited and selected plurality of slices every time said read gradient magnetic field is applied to said object.

10. A nuclear magnetic resonance imaging apparatus according to claim 9, wherein said first and second pulse magnetic fields are applied by first and second RF pulses, and said signal detection means detects said sets of the echo signals every time said read gradient magnetic field corresponding to said first and second RF pulses is applied to said object.

11. A nuclear magnetic resonance imaging apparatus according to claim 9, wherein said magnetic field generation means generates a plurality of said first RF pulse magnetic fields in time sequence.

12. A nuclear magnetic resonance imaging apparatus according to claim 9, wherein said read gradient magnetic field includes a first and second read gradient magnetic fields, and said echo signals from the excited and selected slices are generated according to an amount of the first read gradient magnetic field applied to said plurality of slices and an amount of the second read gradient magnetic field applied to said plurality of slices.

13. A nuclear magnetic resonance imaging apparatus according to claim 9, wherein said read gradient magnetic field includes a first read gradient magnetic field applied in time sequence to said object corresponding to a plurality of said plurality of slices, and a second read gradient magnetic field applied to said object while the polarity thereof inverses alternately;

said first read gradient magnetic field dephases the nuclear spins of said plurality of slices in mutually different quantities; and said second read gradient magnetic field rephases the nuclear spins of a plurality of said slices dephased at mutually different timings corresponding to the dephase quantities within a predetermined cycle of said second read gradient magnetic field to thereby generate the echo signals and at the same time, dephases again the nuclear spins of a plurality of said slices in mutually different quantities.

14. A nuclear magnetic resonance imaging apparatus according to claim 9, wherein said magnetic field generation means repeatedly applies at least twice said second RF pulse magnetic field and said read gradient magnetic field whose polarity alternately inverses with the application of said slice gradient magnetic field and said first RF pulse magnetic field, to said object.

15. A nuclear magnetic resonance imaging apparatus according to claim 13, wherein said first read gradient magnetic field includes a plurality of magnetic pulse signals, and wherein time integration values of amplitudes of said plurality of magnetic pulse signals are equal to one another.

16. A nuclear magnetic resonance imaging apparatus according to claim 15, wherein said second read gradient magnetic field includes a plurality of continuous magnetic field pulses whose polarity alternately reverses in a predetermined cycle, and wherein a time integration value of the amplitude of said continuous magnetic field pulses is substantially equal to three times the time integration value of the amplitude of each of the pulse signals of said first read gradient magnetic field.

17. A nuclear magnetic resonance imaging apparatus for generating a tomographic image of an object by executing at least one pulse sequence including the steps of applying a slice gradient magnetic field and a first radio frequency (RF) pulse magnetic field or first and second RF pulse magnetic fields to said object, generating echo signals by selectively exciting nuclear spins of said object by the application of said first RF pulse magnetic field or said first and second RF pulse magnetic fields, applying a read gradient magnetic field whose polarity continuously inverse at least a plurality of times to said object, and measuring said echo signals; said apparatus comprising:

slice selection means for selecting a plurality of different slices by applying a plurality of RF pulse magnetic fields having mutually different frequencies in time sequence to said object containing the nuclear spins to be detected, and simultaneously applying a slice gradient magnetic field in time sequence to said object;

phase encoding means for effecting phase encoding by applying a phase encoding gradient magnetic field to each of the excited spins of a plurality of said slices which have been selected;

detection means for generating a first read gradient magnetic field for dephasing the nuclear spins of said slices which have been selected and excited, applying said first read gradient magnetic field to said object, generating a second read gradient magnetic field whose polarity alternately inverses within a predetermined cycle, applying said second read gradient magnetic field to said object in synchronism with said phase encoding operation, and detecting a plurality of echo signals in time sequence within a cycle of said second read gradient magnetic field; and image reconstruction means for reconstructing an image of each slice from the echo signal corresponding to each of a plurality of said slices.

18. A nuclear magnetic resonance imaging method for generating a tomographic image of an object by executing at least one pulse sequence including the steps of applying a slice gradient magnetic field and a first radio frequency (RF) pulse magnetic field or first and second RF pulse magnetic fields to said object, generating echo signals by selectively exciting nuclear spins of said object by the application of said first RF pulse magnetic field or said first and second RF pulse magnetic fields, applying a read gradient magnetic field whose polarity continuously inverse at least a plurality of times to said object, and measuring said echo signals; said method comprising the steps of:

generating a plurality of said first RF pulse magnetic fields within one pulse sequence for exciting the nuclear spins of a plurality of different slices and selecting a plurality of said slices; and detecting sets of the echo signals from the excited and selected plurality of slices every time said read gradient magnetic field is applied to said object.

19. A nuclear magnetic resonance imaging apparatus according to claim 18, wherein said first and second pulse magnetic fields are applied by first and second RF pulses, and said signal detection means detects said sets of the echo signals every time said read gradient magnetic field corresponding to said first and second RF pulses is applied to said object.

* * * * *